(12) United States Patent
Wang et al.

(10) Patent No.: US 12,057,504 B2
(45) Date of Patent: Aug. 6, 2024

(54) MINIMIZATION OF SILICON GERMANIUM FACETS IN PLANAR METAL OXIDE SEMICONDUCTOR STRUCTURES

(71) Applicant: TAIWAN SEMICONDUCTOR MANUFACTURING CO., LTD., Hsinchu (TW)

(72) Inventors: Yi-Sin Wang, Tainan (TW); Shan-Yun Cheng, Changhua County (TW); Ching-Hung Kao, Tainan (TW); Jing-Jyu Chou, Taichung (TW); Yi-Ting Chen, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 68 days.

(21) Appl. No.: 17/751,618

(22) Filed: May 23, 2022

(65) Prior Publication Data
US 2022/0285554 A1 Sep. 8, 2022

Related U.S. Application Data

(63) Continuation of application No. 16/821,690, filed on Mar. 17, 2020, now Pat. No. 11,342,455.

(60) Provisional application No. 62/892,431, filed on Aug. 27, 2019.

(51) Int. Cl.
| | |
|---|---|
| *H01L 21/8234* | (2006.01) |
| *H01L 21/762* | (2006.01) |
| *H01L 21/8238* | (2006.01) |
| *H01L 27/092* | (2006.01) |
| *H01L 29/267* | (2006.01) |
| *H01L 29/66* | (2006.01) |
| *H01L 29/78* | (2006.01) |

(52) U.S. Cl.
CPC .... *H01L 29/7848* (2013.01); *H01L 21/76224* (2013.01); *H01L 21/823814* (2013.01); *H01L 21/823878* (2013.01); *H01L 27/092* (2013.01); *H01L 29/267* (2013.01); *H01L 29/66545* (2013.01)

(58) Field of Classification Search
None
See application file for complete search history.

(56) References Cited

U.S. PATENT DOCUMENTS

| | | |
|---|---|---|
| 2015/0325575 A1 | 11/2015 | Park et al. |
| 2016/0093741 A1 | 3/2016 | Yang et al. |
| 2016/0268414 A1 | 9/2016 | Park et al. |

(Continued)

*Primary Examiner* — Joseph C. Nicely
*Assistant Examiner* — Lamont B Koo
(74) *Attorney, Agent, or Firm* — Maschoff Brennan

(57) ABSTRACT

A method and apparatus for minimizing silicon germanium facets in planar metal oxide semiconductor structures is disclosed. For example, a device fabricated according to the method may include a semiconductor substrate, a plurality of gate stacks formed on the substrate, a plurality of source/drain regions formed from silicon germanium, and a shallow trench isolation region positioned between two source/drain regions of the plurality of source/drain regions. Each source/drain region of the plurality of source/drain regions is positioned adjacent to at least one gate stack of the plurality of gate stacks. Moreover, the shallow trench isolation region forms a trench in the substrate without intersecting the two source/drain regions.

20 Claims, 15 Drawing Sheets

(56) References Cited

U.S. PATENT DOCUMENTS

2016/0358913 A1\* 12/2016 Kim ................ H01L 21/823431
2017/0084461 A1   3/2017 Colinge et al.
2017/0110456 A1   4/2017 Jeon et al.
2019/0139831 A1   5/2019 Zhu \* cited by examiner

MINIMIZATION OF SILICON GERMANIUM FACETS IN PLANAR METAL OXIDE SEMICONDUCTOR STRUCTURES

PRIORITY DATA

This application is a Continuation Application of the U.S. application Ser. No. 16/821,690, filed Mar. 17, 2020, now U.S. Pat. No. 11,342,455, issued May 24, 2022, which claims priority to U.S. Provisional Patent Application Ser. No. 62/892,431, filed Aug. 27, 2019, all of which are herein incorporated by reference in their entirety.

BACKGROUND

Silicon germanium is often used as a mechanical stressor in complementary metal oxide semiconductor (CMOS) processing to increase carrier mobility and enhance transistor performance in metal oxide semiconductor field effect transistors (MOSFETs). For example, the performance of a p-type MOSFET may be enhanced by using silicon germanium to apply a compressive stress to the MOSFET's channel. Conversely, the performance of an n-type MOSFET may be enhanced by using silicon germanium to apply a tensile stress to the MOSFET's channel. The silicon germanium is typically introduced as a stressor by growing the silicon germanium epitaxially within recesses in the source/drain (S/D) regions of the transistor.

It is also common in CMOS processing to etch a trench in the silicon in order to prevent electric current leakage between adjacent transistors. The etching of the trench is referred to as shallow trench isolation (STI).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
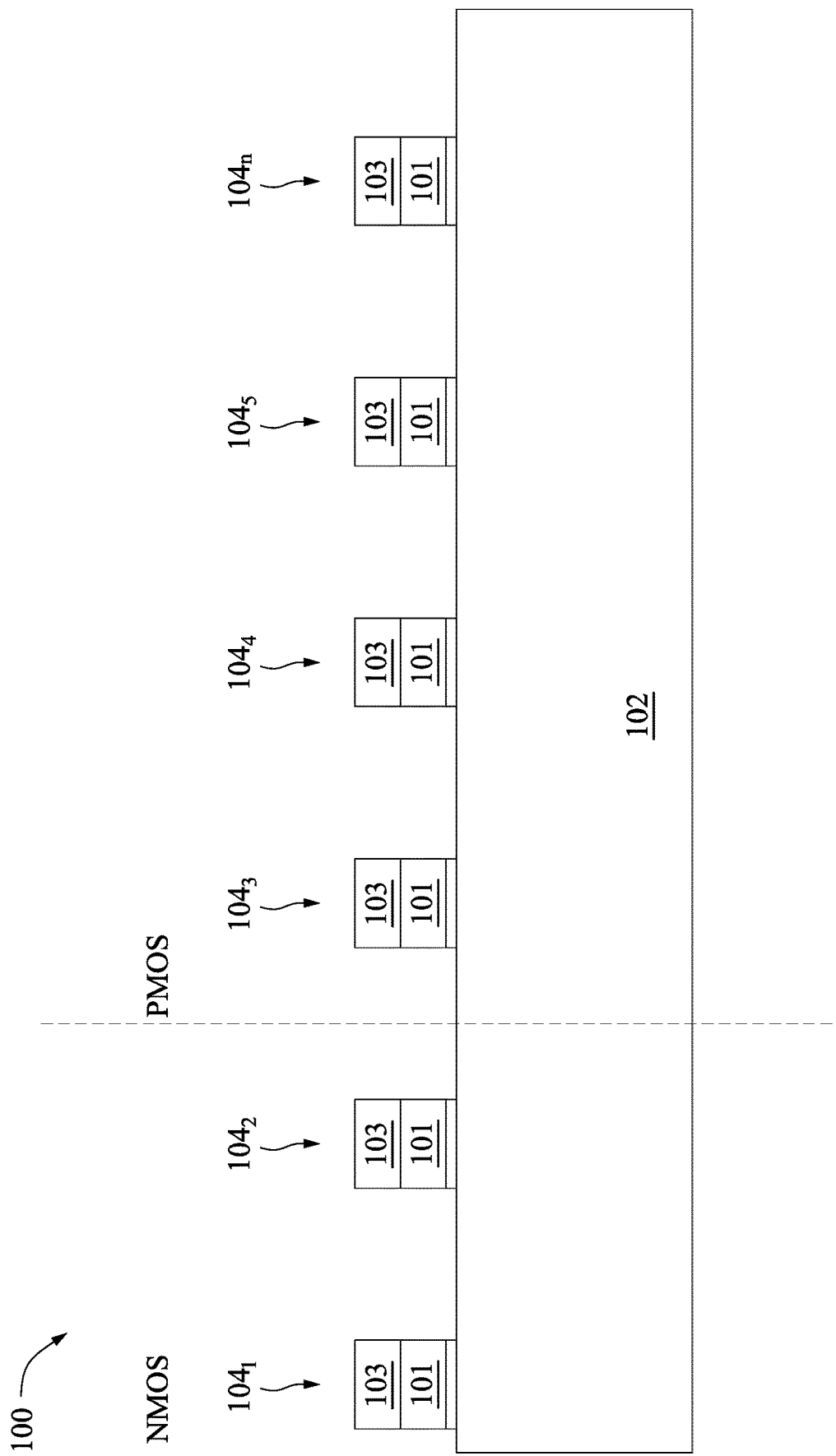
FIGS. 1A-1M are cross sectional views illustrating a portion of a semiconductor structure at various steps of an example fabrication process according to at least one example of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In one example, the present disclosure provides a planar metal oxide semiconductor (MOS) structure, and a method for fabricating the structure, in which silicon germanium facet formation along the shallow trench isolation (STI) areas is minimized. As discussed above, silicon germanium is often introduced as a mechanical stressor in CMOS processing by growing the silicon germanium epitaxially within recesses in the source/drain regions of the transistor. For example, applying a compressive stress to the channel of a p-type MOSFET using silicon germanium may enhance the performance of the p-type MOSFET. Conversely, applying a tensile stress to the channel of an n-type MOSFET may enhance the performance of the n-type MOSFET.

However, the various crystal growth conditions of silicon germanium, as well as the fact that the silicon germanium regions are often grown after formation of the shallow trench isolation areas, may occasionally create faceted epitaxy near the bottom of the recesses, along the shallow trench isolation regions between transistors. These facets resemble source/drain regions that have not been fully formed, so that it may appear as if the shallow trench isolation region truncates or intersects the silicon germanium source/drain region.

Silicon germanium facets can negatively impact device performance, e.g., by undermining the strain inducing effects that the silicon germanium is meant to provide. In other words, the full benefits of introducing the silicon germanium as a mechanical stressor may not be realized, because the silicon germanium source/drain regions are not able to grow fully. Conventional techniques that aim to promote the growth of intact, fully formed silicon germanium source/drain regions have drawbacks, however. For instance, some techniques include separating the oxidation diffusion (OD) layer of the device into two or more sections, and then fabricating multiple dummy polysilicon mask areas at the oxidation diffusion/shallow trench isolation interface to accommodate later etching of a wide, facet-free shallow trench isolation area. However, these techniques require that a large amount of device space be reserved for the formation of structures that may later be sacrificed (e.g., dummy or mask areas that may not be replaced by other components) or that are larger than necessary (e.g., wide shallow trench isolation areas formed directly beneath or directly between dummy structures).

Examples of the present disclosure form the shallow trench isolation areas of a planar MOS device after the gate stacks and the silicon germanium source/drain regions are fabricated, rather than forming the shallow trench isolation areas before gate stack fabrication as is the conventional approach. In one particular example, a plurality of dummy polysilicon gate stacks may initially be formed on an intact oxidation diffusion layer of a substrate (e.g., an oxidation diffusion layer in which there are no diffusion breaks). Silicon germanium source/drain regions may then be grown epitaxially in recesses formed between the dummy gate stacks. Subsequently, a first subset of the dummy gate stacks may be replaced with functional PMOS gates, and a second subset of the dummy gate stacks may be replaced with functional NMOS gates. Trenches may be etched in place of the gate stacks in a third subset of the dummy gate stacks, which are located in regions where shallow trench isolation areas are to be formed. The trenches extend into the device substrate; however, the etching of the trenches does not truncate any of the existing silicon germanium source/drain regions in the substrate. The trenches are then filled with a material that prevents current leakage, e.g., according to conventional processes for forming shallow trench isolation areas.

FIGS. 1A-1M are cross sectional views illustrating a portion of a semiconductor structure 100 at various steps of an example fabrication process according to the present disclosure. As such, FIGS. 1A-1M may also serve as a flow diagram for various steps of the example fabrication process disclosed herein.

FIG. 1A illustrates the semiconductor structure 100 during an intermediate processing step of the example fabrication process. In one example, FIG. 1A illustrates the semiconductor structure 100 after the formation of a plurality of gate stacks. Specifically, at the stage illustrated in FIG. 1A, the semiconductor structure 100 may generally comprise a semiconductor substrate 102 having a plurality of gate stacks $104_1$-$104_n$ (hereinafter individually referred to as a "gate stack 104" or collectively referred to as "gate stacks 104") formed thereon. As illustrated, some of the gate stacks 104 may be located in an n-type MOS (NMOS) region of the semiconductor structure 100, while other gate stacks 104 may be located in a p-type MOS (PMOS) region of the semiconductor structure 100.

In one example, the substrate 102 may be formed from silicon (Si) or another semiconductor material. Alternatively or in addition, the substrate 102 may include other elementary semiconductor materials, such as germanium (Ge). In some examples, the substrate 102 may be formed from a compound semiconductor such as silicon carbide (SiC), gallium arsenic (GaAs), indium arsenide (InAs), or indium phosphide (InP). In further examples, the substrate 102 may be formed from an alloy semiconductor such as silicon germanium (SiGe), silicon germanium carbide (SiGeC), gallium arsenic phosphide (GaAsP), or gallium indium phosphide (GaInP). In still further examples, the substrate 102 may include an epitaxial layer overlying a bulk semiconductor layer.

In one example, each of the gate stacks 104 comprises a "dummy" gate stack, e.g., a sacrificial structure that does not allow for the flow of electricity, and that may be replaced, later in the fabrication process, with another structure. For instance, as discussed in further detail below, a first subset of the gate stacks 104 may be replaced with functional PMOS gate stacks, a second subset of the gate stacks 104 may be replaced with functional NMOS gate stacks, and a third subset of the gate stacks 104 may be replaced with shallow trench isolation areas. However, at the fabrication stage illustrated in FIG. 1A, each of the gate stacks 104 may comprise a polysilicon layer 101 and a hard mask layer 103 formed over the polysilicon layer 101.

In one example, the hard mask layer 103 may be formed of organic materials such as amorphous carbon or organosiloxane-based materials. In another example, the hard mask layer 103 may be formed of inorganic materials such as silicon nitride (SiN), silicon oxynitride ($SiO_xN_y$), or titanium nitride (TiN). In one example, the hard mask layer may be deposited by a chemical vapor deposition (CVD) process or a spin-on process. In one example, each of the dummy gate stacks may additionally include a gate dielectric layer positioned between the substrate 102 and the polysilicon layer 101.

The gate dielectric layer may be formed directly on the substrate 102, and may comprise silicon oxide ($SiO_2$), silicon oxynitride ($SiO_xN_y$), and/or a high dielectric constant (high k) material. Where the gate dielectric layer includes a high dielectric constant material, the high dielectric constant material may comprise hafnium oxide ($HfO_2$), hafnium silicon oxide (HfSiO), hafnium silicon oxynitride (HfSiON), hafnium tantalum oxide (HfTaO), hafnium titanium oxide (HfTiO), or hafnium zirconium oxide (HfZrnO). The high dielectric constant material may also include metal oxides, metal nitrides, metal silicates, transition metal oxides, transition metal nitrides, transition metal silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina ($HfO_2$_$Al_2O_3$) alloy, or the like. The gate dielectric layer may be formed by any suitable process, such as atomic layer deposition (ALD), chemical vapor deposition (CVD), physical vapor deposition (PVD), remote plasma chemical vapor deposition (RPCVD), plasma enhanced chemical vapor deposition (PECVD), metal organic chemical vapor deposition (MOCVD), sputtering, plating, or the like.

Figure 1B:
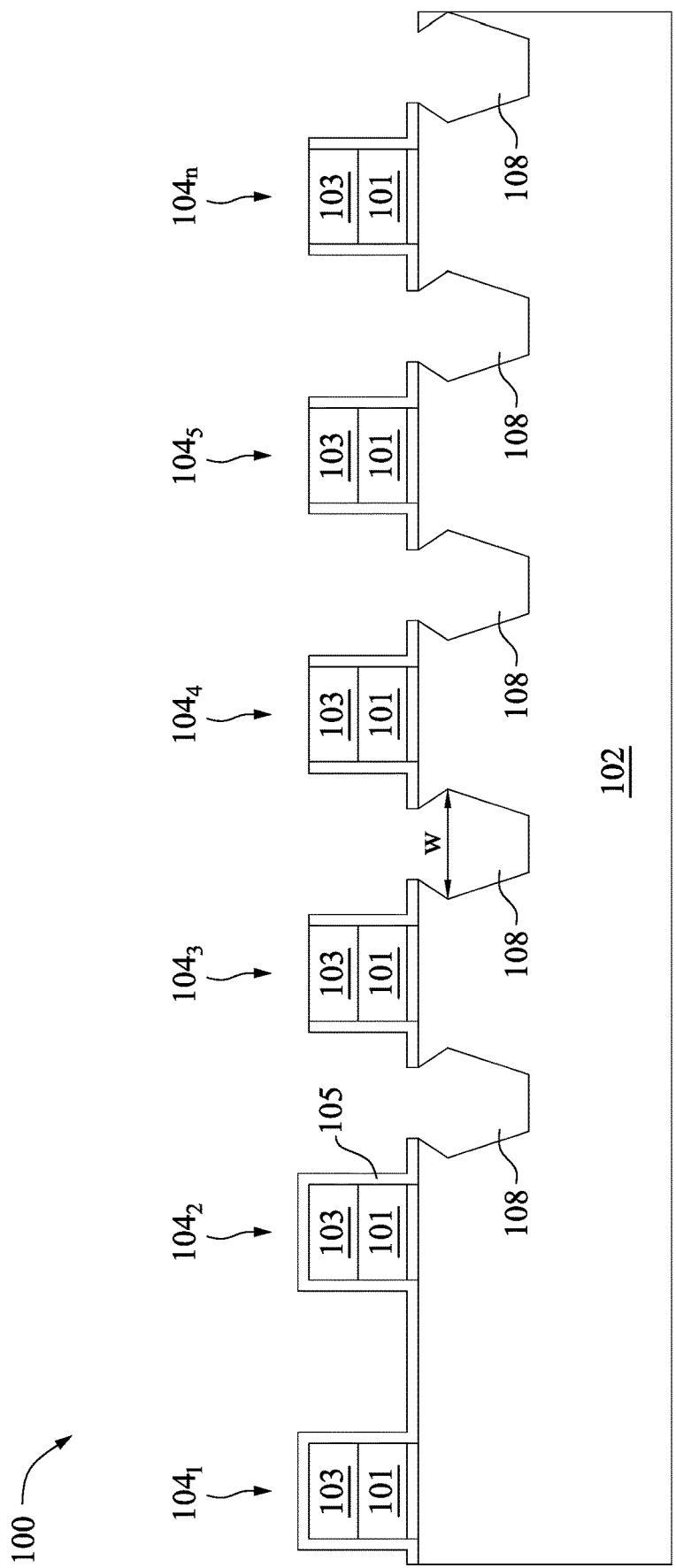

As illustrated in FIG. 1B, after the gate stacks 104 are formed on the substrate 102, a plurality of recesses 108 may be formed in the substrate 102, in the PMOS region of the semiconductor structure 100. In one example, each recess 108 is formed between a pair of gate stacks 104 (e.g., where the gate stacks 104 between which a recess 108 is formed will eventually be replaced with two functional PMOS gate stacks or with one functional PMOS gate stack and one shallow trench isolation area.

The recesses 108 may be formed, for example, by a lithography process, followed by a dry etching process and a wet etching process. For instance, a conformal oxide layer 105 may be deposited over the substrate 102 and the gate stacks 104. A photoresist layer (not shown) may then be deposited over the oxide layer 105, e.g., by spin coating. A photomask (not shown) may then be placed over the semiconductor structure 100, and the semiconductor structure 100 may be exposed to a pattern of intense light and to a developer. Collectively, the exposure to the light and to the developer may cause the removal of portions of the photoresist layer (i.e., portions of the photoresist layer residing between the pairs of gate stacks 104 discussed above).

In one example, a dry etching processes may be performed after the lithography process in order to remove the now-exposed portions of the oxide layer 105. The dry etching process may use a gas such as helium (He), argon (Ar), helium bromide (HeBr), dinitrogen ($N_2$), methane ($CH_4$), tetrafluoromethane ($CF_4$), fluoromethane ($CH_3F$), difluoromethane ($Ch_2F_2$), fluoroform ($CHF_3$), and/or oxygen ($O_2$) to remove the exposed portions of the oxide layer 105. In further examples, the dry etching process may also remove portions of the substrate 102 residing below the exposed portions of the oxide layer 105. The removal of portions of the substrate 102 may result in recesses 108 being formed in the substrate 102, as illustrated in FIG. 1B.

In one example, the dry etching process may be followed with a wet etching process that enlarges or widens the recesses 108. The wet etching process may use an etching solution including ammonium hydroxide ($NH_4OH$), potassium hydroxide (KOH), hydrofluoric acid (HF), tetramethyl ammonium hydroxide (TMAH), or other solutions. Thus, in one example, a dry etching process may etch recesses 108 having first dimensions. The first dimensions may include a first maximum width (i.e., the width of a recess 108 at the widest point). However, the subsequent wet etching process may further etch the recesses so that the recesses have second dimensions. The second dimensions may include a second maximum width w that is wider than the first maximum width. For instance, it can be seen in FIG. 1B that any recess 108 extends, at its maximum width w, slightly below the edges of the remaining oxide layer 105.

The wet etching process may also deepen the recesses 108. For instance, the dry etching process may etch the recesses 108 to a first depth in the substrate 102. The subsequent wet etching process may further etch the recesses 108 to a second depth in the substrate 102 that is deeper than the first depth. In one example, the finished recesses 108 (e.g., the recesses 108 that are formed after the wet etching process) may be anywhere from thirty-seven nanometers to forty-three nanometers deep. The dimensions and profiles of the recesses 108 are discussed in further detail below in connection with FIG. 2A.

Figure 1C:
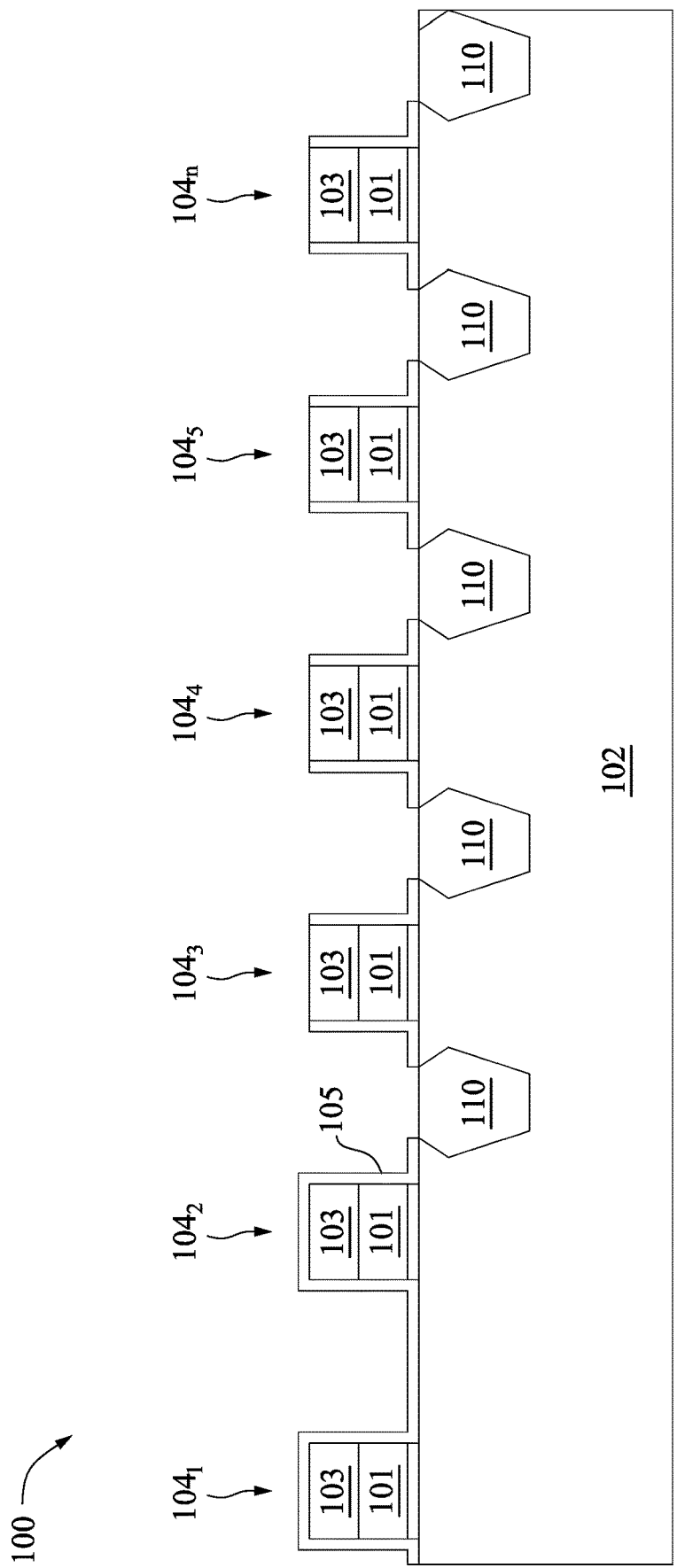

As illustrated in FIG. 1C, silicon germanium may next be formed in the recesses 108 to produce strained source and drain (S/D) regions 110. In one example, the silicon germanium is grown epitaxially in the recesses 108. For instance, a process such as selective epitaxy growth, chemical vapor deposition (e.g., vapor-phase epitaxy or ultra-high vacuum chemical vapor deposition), molecular beam epitaxy, or the like may be used to grow the silicon germanium in the recesses 108. The epitaxy process may use gaseous and/or liquid precursors, which may interact with the composition of the substrate 102. As a result, a channel region of the semiconductor structure 100 may be strained or stressed to enable carrier mobility and to enhance device performance. In one example, the source/drain regions 110 may also be doped. Doping of the source/drain regions 110 may occur in situ (e.g., during the epitaxial process) or after the epitaxial process. In one example, doping is performed using an ion implantation process, a plasma immersion ion implantation process, or another suitable process. In further examples, the source/drain regions 110 may be further exposed to an annealing process, such as rapid thermal annealing.

Once the source/drain regions 110 are formed, at least some of the gate stacks 104 may be replaced with functional (PMOS or NMOS) gate stacks.

For instance, a self-aligned silicide (or "salicide") process may be performed, followed by the deposition of a first interlayer dielectric (ILD) layer 114. The salicide and interlayer dielectric processes may result in a structure such as that illustrated in FIG. 1D. For instance, each gate stack 104 may now include gate spacers 106 formed on the sidewalls of the gate stack 104. The gate spacers 106 may be formed, for example, from silicon oxide, silicon nitride, silicon oxynitride, and/or other dielectric materials. In one example, the gate spacers 106 may include a single layer of material. However, in another example, the gate spacers may include multiple layers of potentially different materials. In one example, the gate spacers 106 may be formed by depositing a dielectric layer over the substrate 102 and the gate stacks 104, and then etching the dielectric layer to form the gate spacers 106.

An optional etch stop layer 112 may be formed over the gate spacers 106 and source/drain regions 110. The etch stop layer 112 may be a thin, conformal layer of material, such as a metal nitride (e.g., silicon nitride, silicon carbide, silicon carbonitride, or the like). In one example, the etch stop layer 112 may be formed via a process such as chemical vapor deposition or atomic layer deposition.

The semiconductor structure 100 may additionally include silicide contacts (not shown) created in the active regions of the semiconductor structure 100 via the silicide process, as well as the first interlayer dielectric layer 114, which may be deposited over the etch stop layer 112 and may fill in the spaces around and between the gate stacks 104 in both the PMOS region and the NMOS region. The first interlayer dielectric layer 114 may comprise phosphosilicate glass (PSG), borosilicate glass (BSG), boron-doped phosphosilicate glass (BPSG), fluorine-doped silicate glass (FSG), tetraethyl orthosilicate (TEOS), or another insulator material, such as silicon oxide, silicon nitride, or silicon oxynitride. The first interlayer dielectric layer 114 may be formed using high-density plasma (HDP) chemical vapor deposition (CVD), spin coating, flowable chemical vapor deposition, plasma enhanced chemical vapor deposition, low pressure chemical vapor deposition, or another process.

Figure 1D:
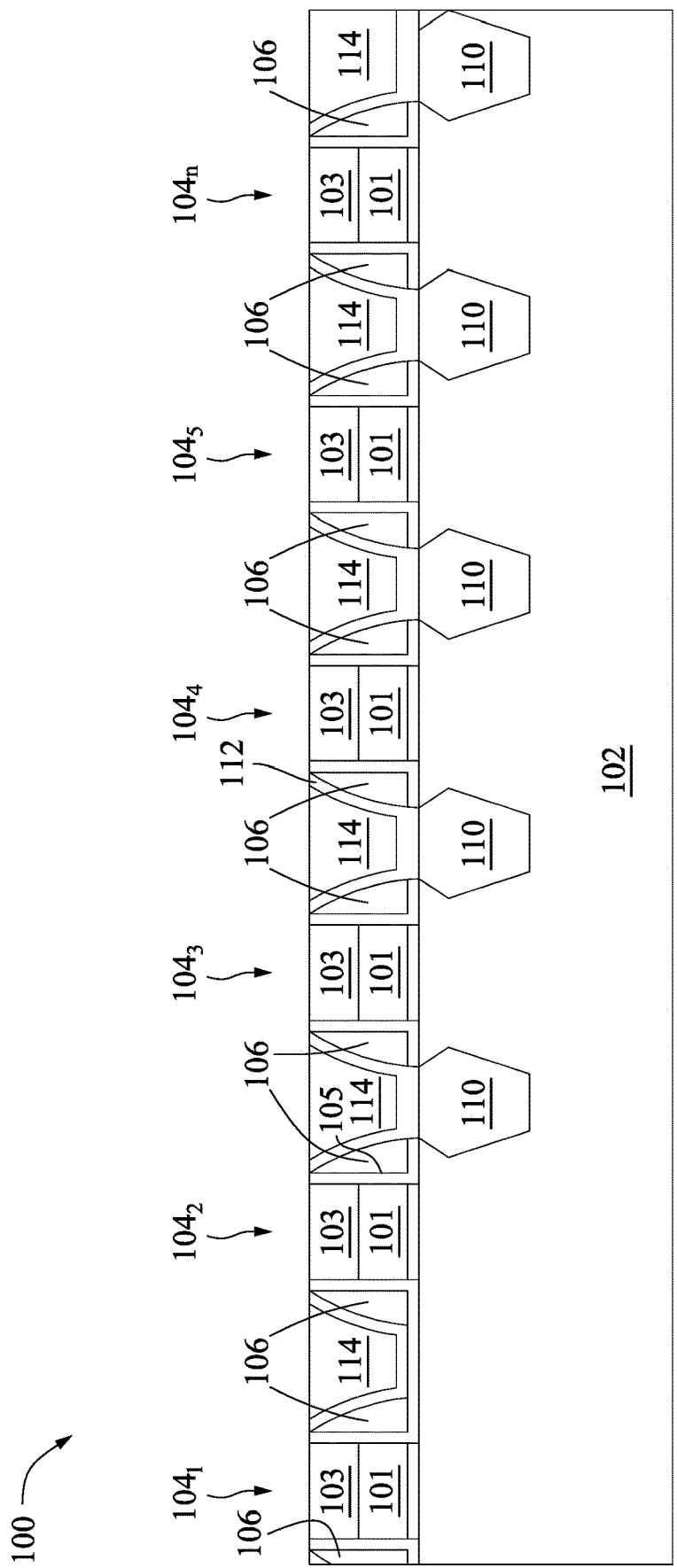

As illustrated in FIG. 1D, the first interlayer dielectric layer 114 may be planarized, so that the first interlayer dielectric layer 114 is level with the tops of the gate stacks 104. For instance, a chemical mechanical planarization (CMP) process may be employed to remove a portion of the first interlayer dielectric layer 114. The chemical mechanical planarization process may also remove the portions of the etch stop layer 112 that reside over the tops of the gate stacks 104.

Figure 1E:
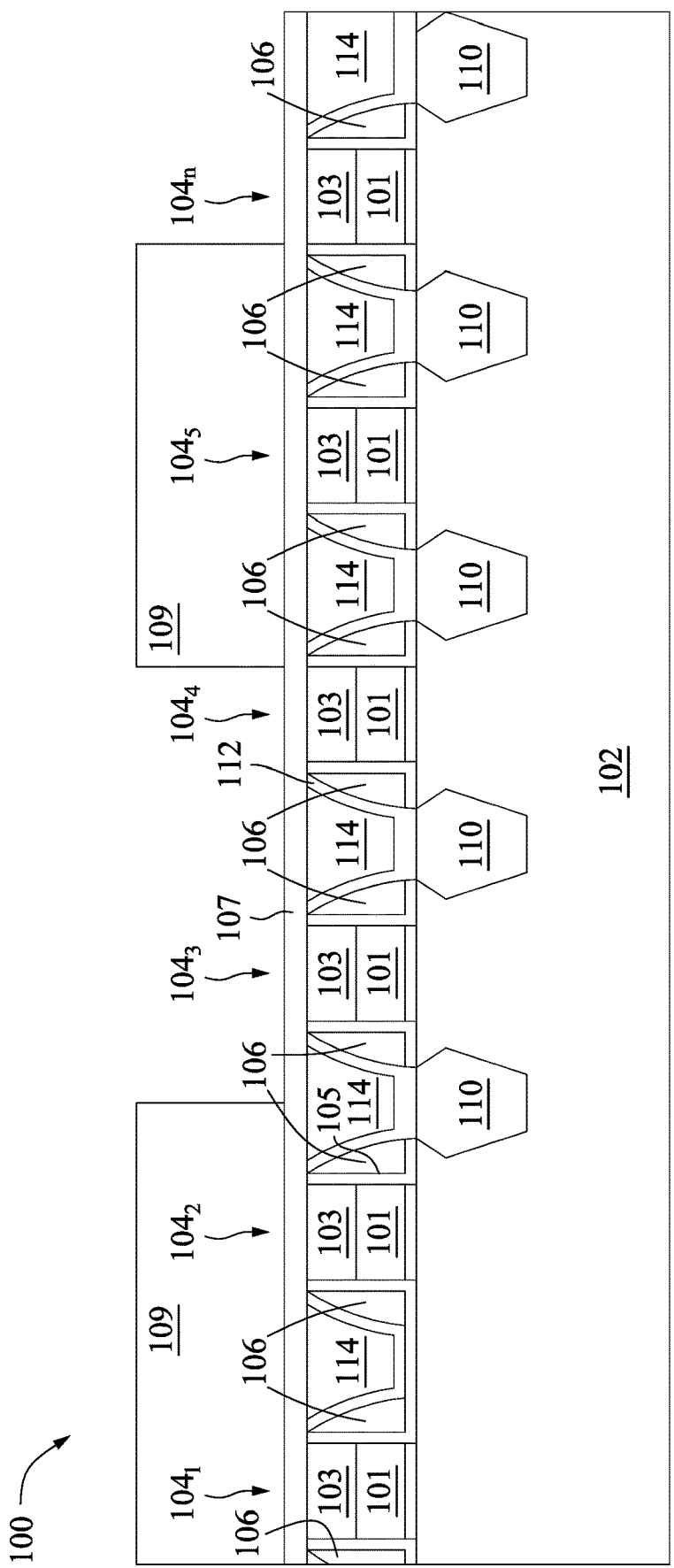

A lithography process may next be employed to expose at least some of the gate stacks 104 in the PMOS region of the semiconductor structure for a gate replacement process. For instance, as illustrated in FIG. 1E, a first photoresist layer 107 may be deposited (e.g., via spin coating) over the planarized first interlayer dielectric layer 114. A mask 109 may be placed over the first photoresist layer 107. The mask 109 may include a pattern, e.g., openings over those of the gate stacks 104 which are to be replaced with functional PMOS gates (e.g., gate stacks $104_3$, $104_4$, and $104_n$ in FIG. 1E). Intense light exposure may then be used to transfer the pattern from the mask 109 to the first photoresist layer 107. In particular, the light passes through openings in the mask 109, and the portions of the first photoresist layer 107 that lie below the openings are removed.

Figure 1F:
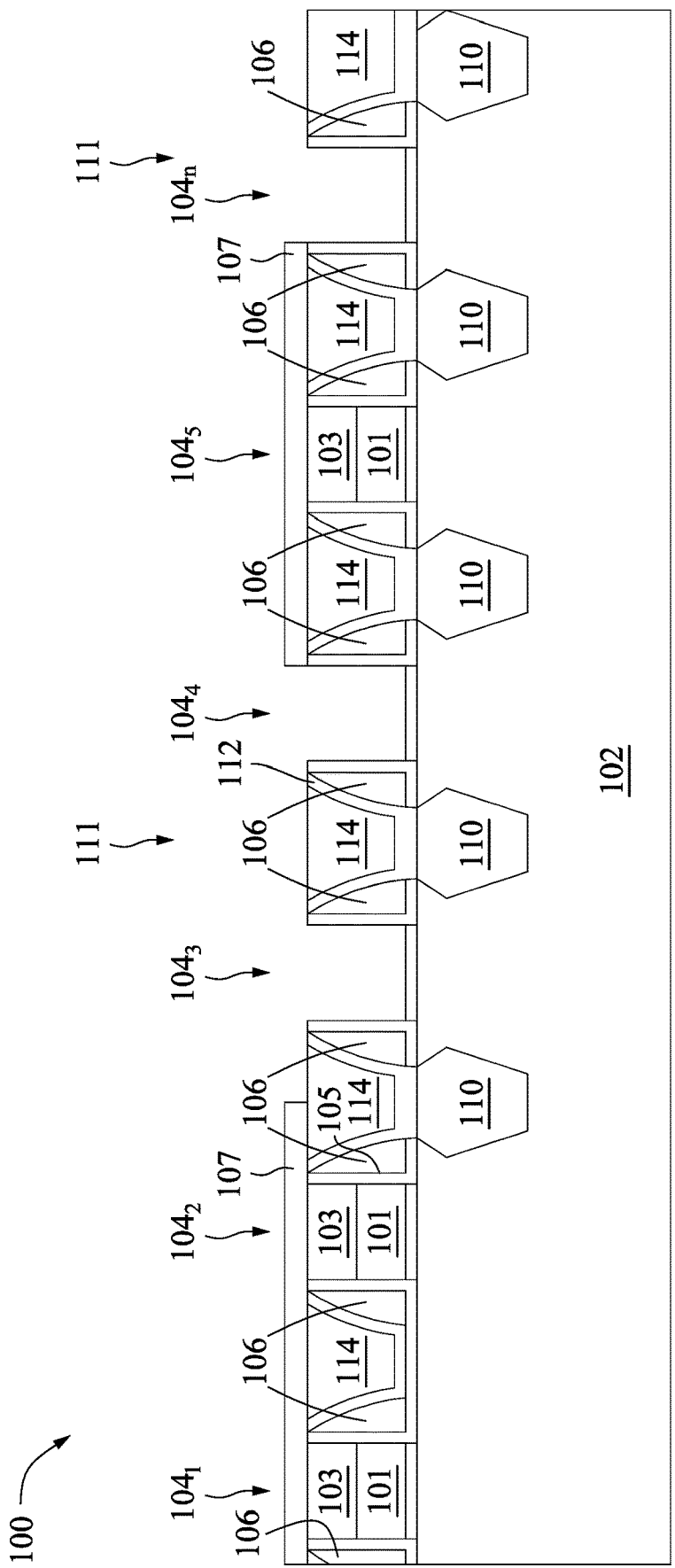

As illustrated in FIG. 1F, this results in an opening 111 being formed in the first photoresist layer 107 above each dummy gate 104 that is to be replaced with a functional PMOS gate. An etch process may remove the polysilicon layer 101 and the mask layer 103 of each dummy gate 104 that is exposed, as shown, to create recessed gate stacks $104_3$, $104_4$, and $104_n$.

Figure 1G:
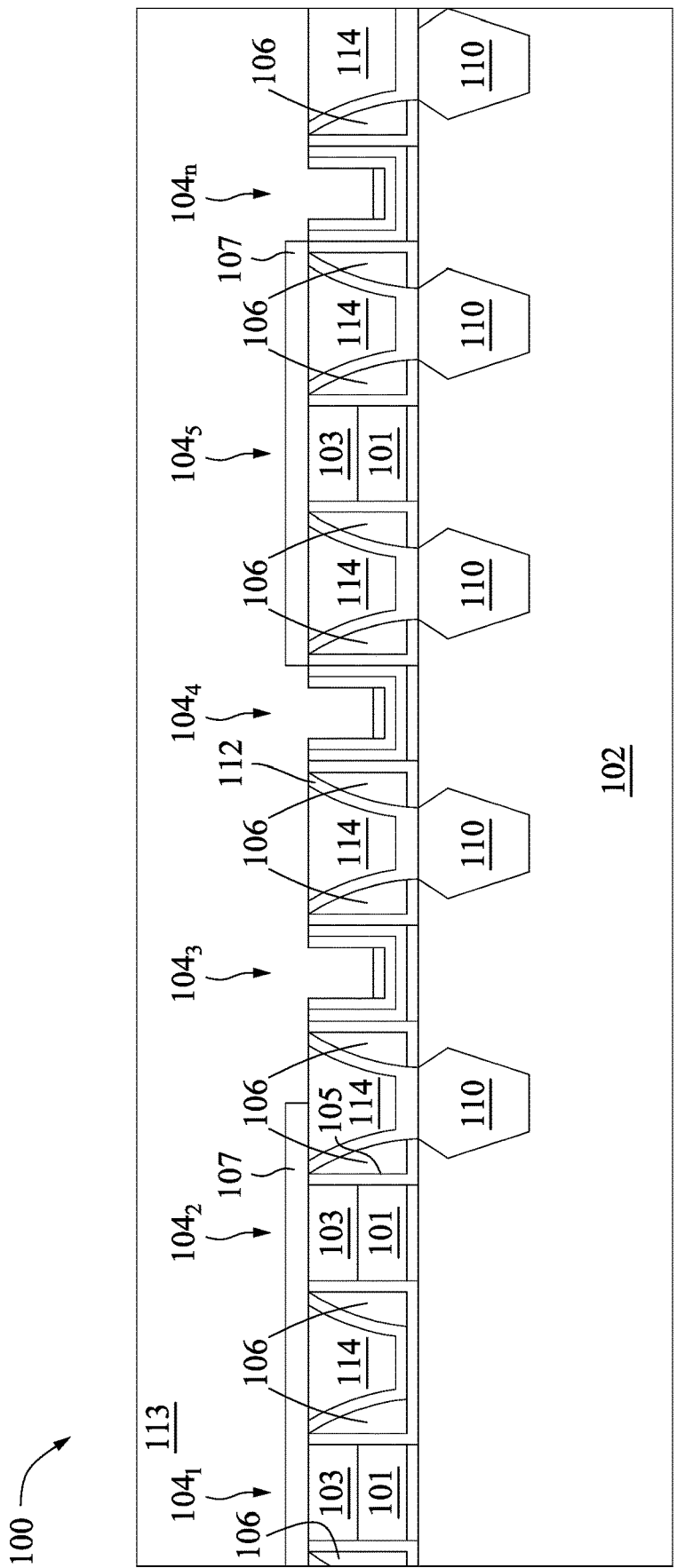

As illustrated in FIG. 1G, the mask 109 may be removed, and one or more layers 113 of metal may be deposited over the semiconductor structure 100. These one or more layers 113 of metal may fill in the recessed gate stacks $104_3$, $104_4$, and $104_n$, thereby creating functional PMOS gates. A functional gate may include a plurality of layers, such as the aforementioned gate dielectric layer, a gate electrode, and/or a mask layer.

The gate electrode layer of the functional gate may be formed from polysilicon, metal, or metal silicide, and may be formed directly on the gate dielectric layer. The gate electrode layer may be formed using a chemical vapor deposition process, such as any of the chemical vapor deposition processes discussed in connection with the formation of the gate dielectric layer.

The mask layer of the functional gate may be formed directly on the gate electrode layer. In one example, the mask layer may be formed from silicon oxynitride or a similar material. Once the gate dielectric layer, the gate electrode layer, and the mask layer are formed, a photolithography process and/or an etching process may be used to pattern the plurality of layers into the gate stack structure that is illustrated in FIG. 1G.

In a further example, the functional gate may include one or more additional layers, such as a capping layer, an interface layer, a diffusion layer, and/or a barrier layer. Collectively, the layers of the functional gate may allow electricity to flow from the gate's source to the gate's drain when the gate is ON.

Figure 1H:
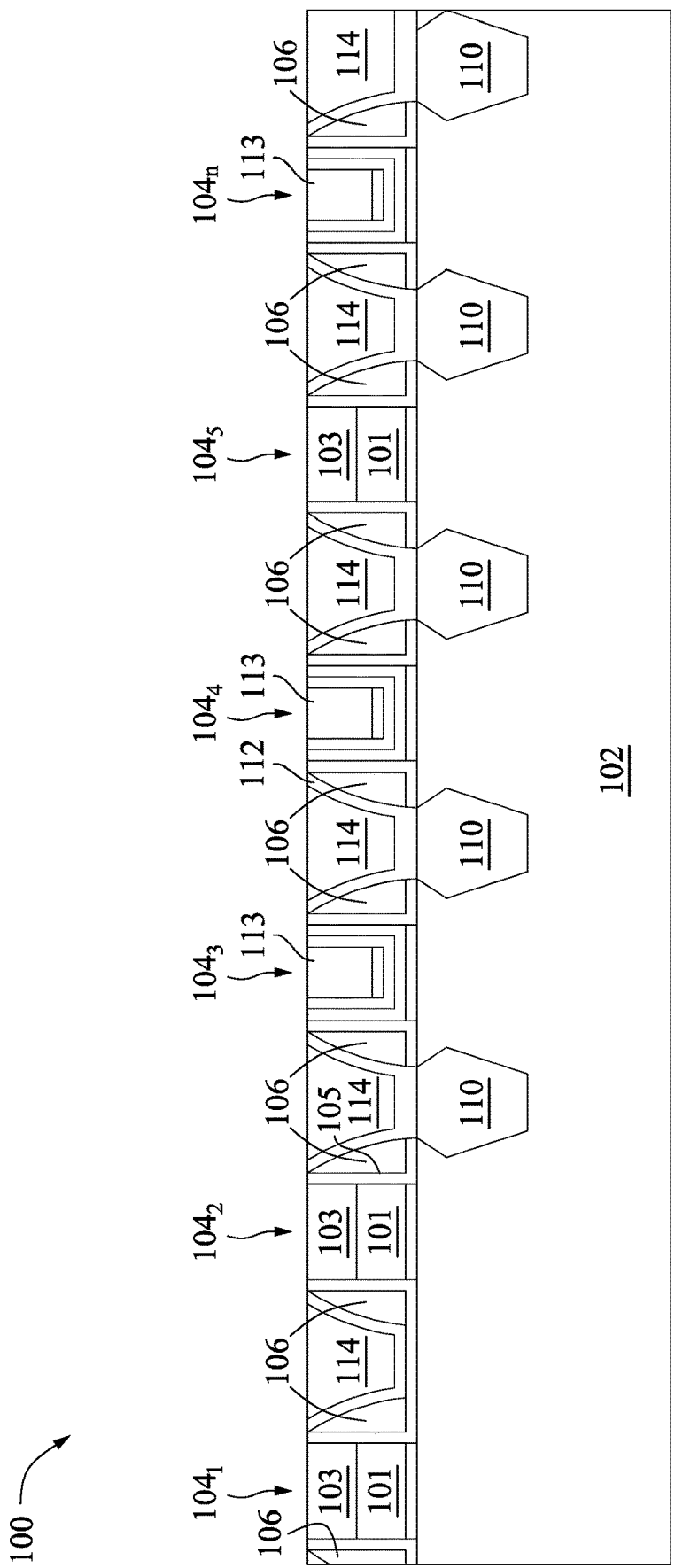

As illustrated in FIG. 1H, the one or more layers of metal 113, as well as the first photoresist layer 107, may next be planarized down to the tops of the gate stacks 104.

Figure 1I:
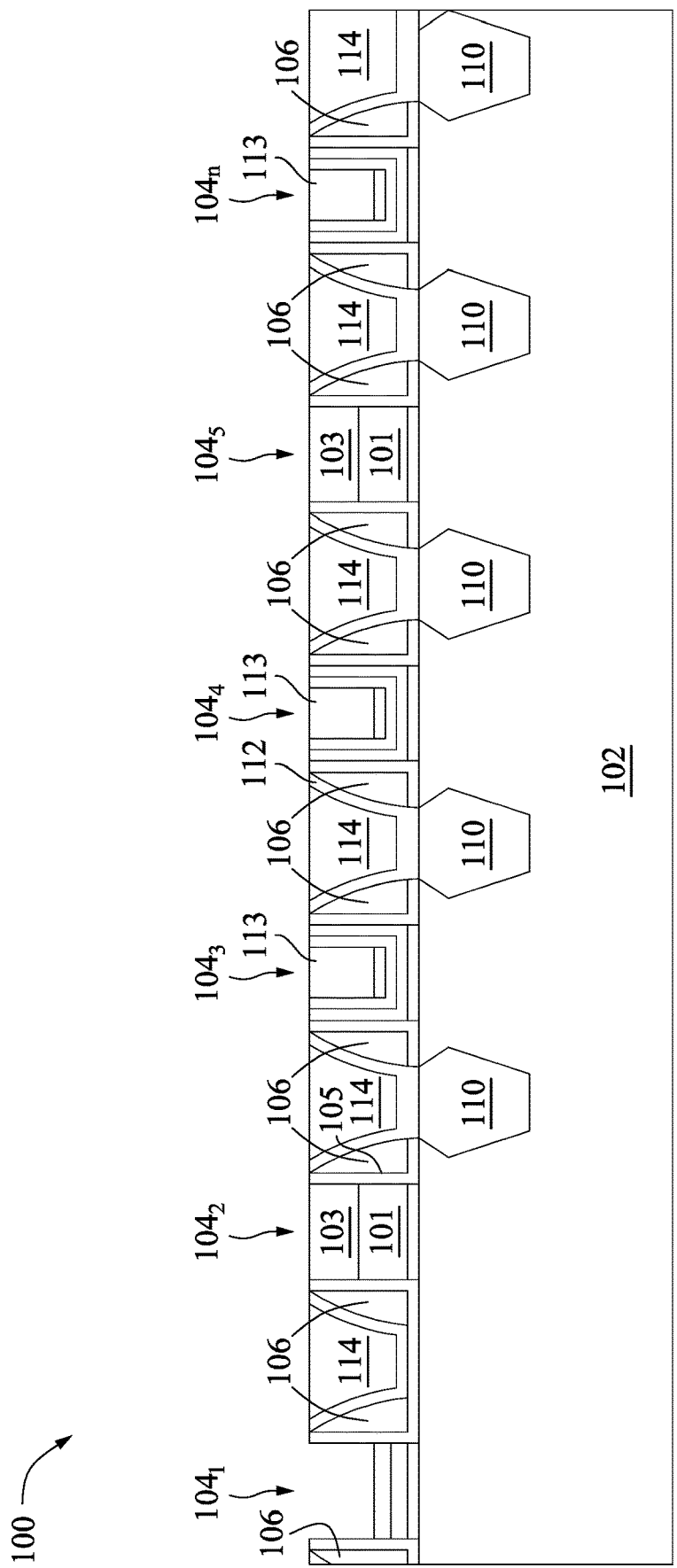

In addition, as illustrated in FIG. 1I, a lithography process may next be employed to expose at least some of the gate stacks 104 in the NMOS region of the semiconductor structure for a gate replacement process. The lithography process for the NMOS region may be carried out in a manner similar to the lithography process discussed above for the PMOS region (e.g., as illustrated in FIGS. 1E-1F, but with the mask protecting the formed PMOS region). A subsequent etch process may remove the polysilicon layer 101 and the mask layer 103 of each dummy gate 104 that is exposed (e.g., gate stack $104_1$ in FIG. 1I), as shown, to create recessed gate stacks $104_1$.

Figure 1J:
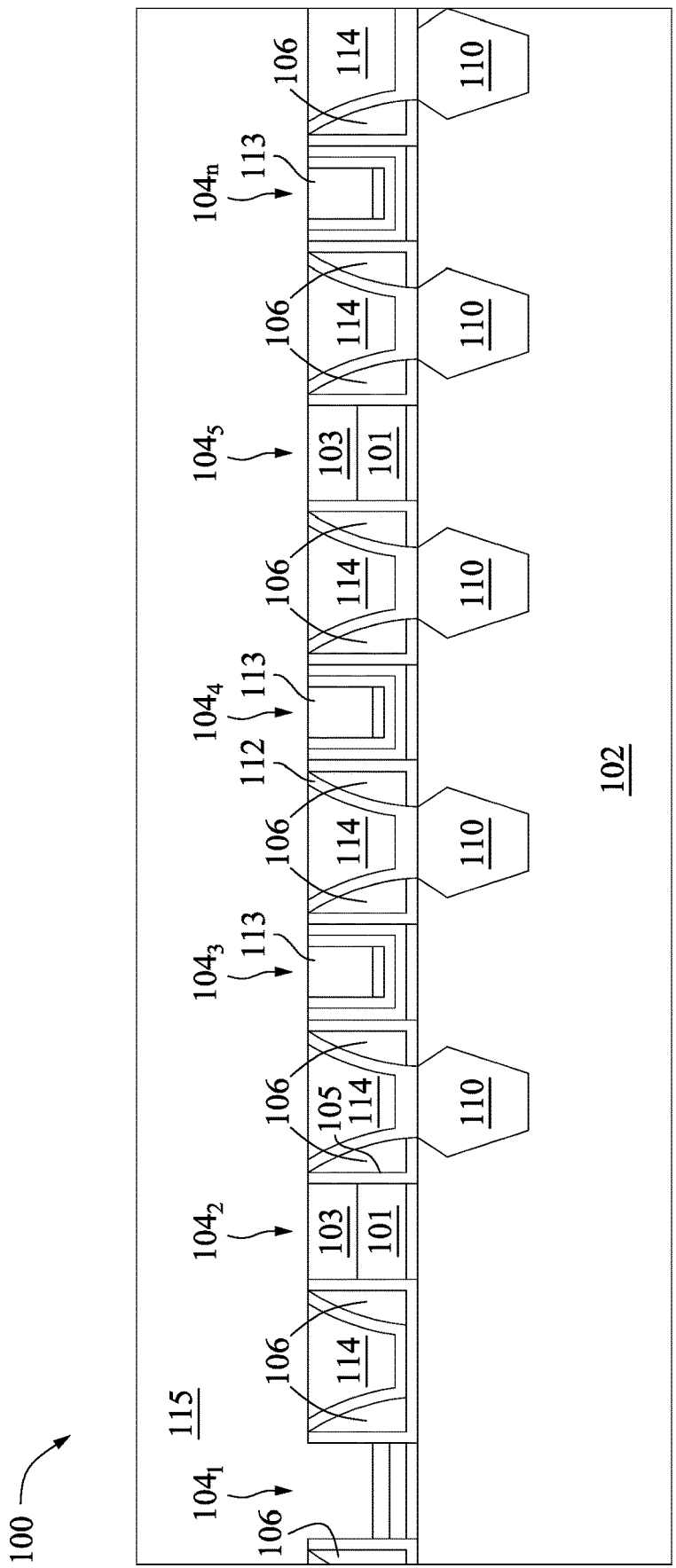

As illustrated in FIG. 1J, the mask over the PMOS region may be removed, and one or more layers 115 of metal may be deposited over the semiconductor structure 100. These one or more layers 115 of metal may fill in the recessed gate stacks $104_1$, thereby creating functional NMOS gates. A functional gate may include a plurality of layers, such as the aforementioned gate dielectric layer, a gate electrode, and/or a mask layer. The same materials discussed above in connection with the PMOS gates may be used to form the layers of the NMOS gates. However, the precise composition (combinations and/or amounts) of the materials making up the functional NMOS gates may differ from the composition of the materials making up the functional PMOS gates. That is the, the composition of the NMOS gates may not be identical to the composition of the PMOS gates.

Thus, the gate stacks 104 may include, at this point in the fabrication process, a first subset comprising functional PMOS gates (i.e., gate stacks $104_3$, $104_4$, and $104_n$) and a second subset comprising functional NMOS gates (i.e., gate stack $104_1$). In addition, a third subset of the gate stacks 104 (i.e., gate stacks $104_2$ and $104_5$ in FIG. 1J) may remain unchanged at this stage in the fabrication process. This third subset, which includes gate stacks 104 located in the PMOS region of the semiconductor structure 100 or located on the border of the PMOS region and the NMOS region, may remain as non-functional dummy gates.

Figure 1K:
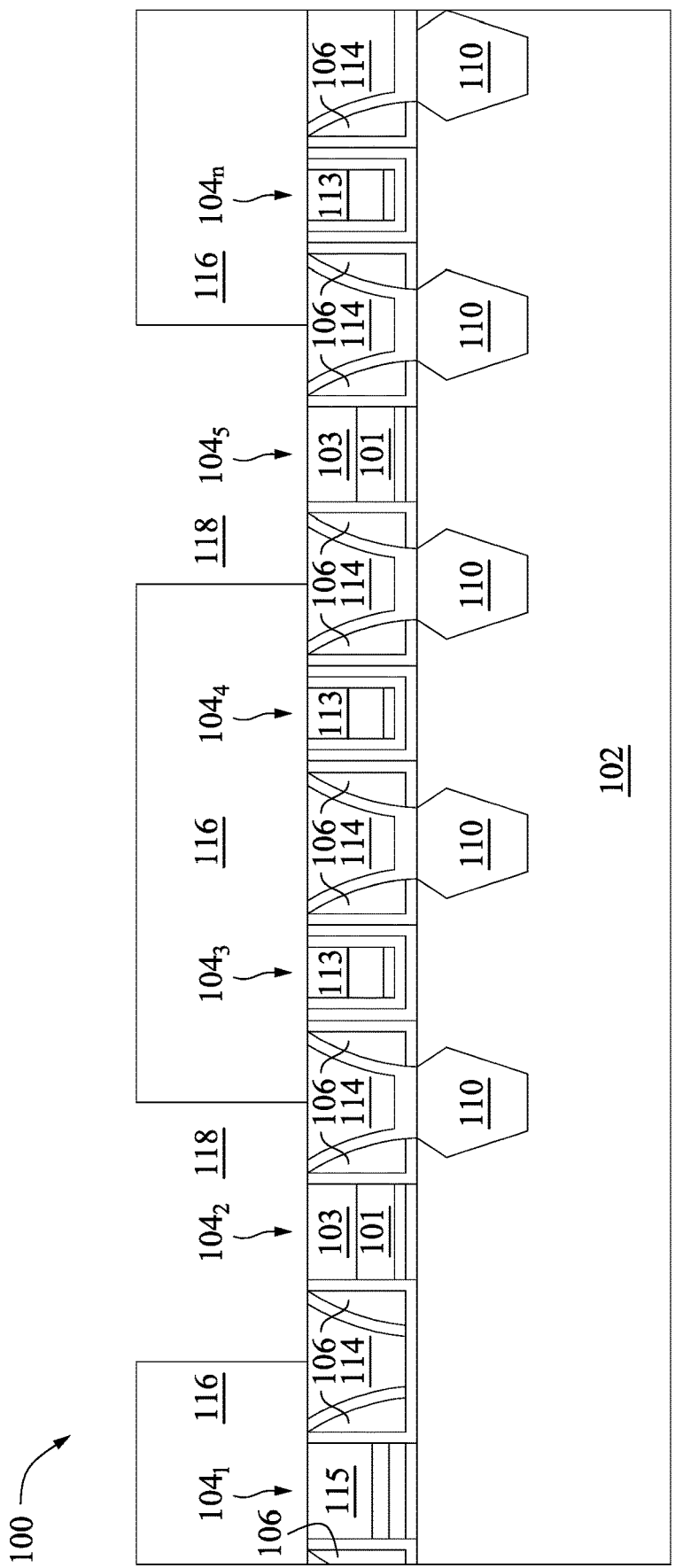

As illustrated in FIG. 1K, the one or more layers of metal 115 may be planarized, similar to the one or more layers of metal 113 discussed above. Alithography process may next be employed to expose the remaining dummy gates $104_2$ and $104_5$. For instance, a photoresist layer 116 may be deposited (e.g., via spin coating) over the semiconductor structure 100, in both the PMOS region and the NMOS region. A patterned mask (not shown) may be placed over the photoresist layer 116. The patterned mask may include an opening above each dummy gate. Intense light exposure is then used to transfer the pattern from the mask to the photoresist layer 116. In particular, the light passes through openings in the mask, and the portions of the photoresist layer 116 that lie below the openings are removed. As illustrated in FIG. 1K, this results in an opening 118 being formed in the photoresist layer 116 above each dummy gate.

Figure 1L:
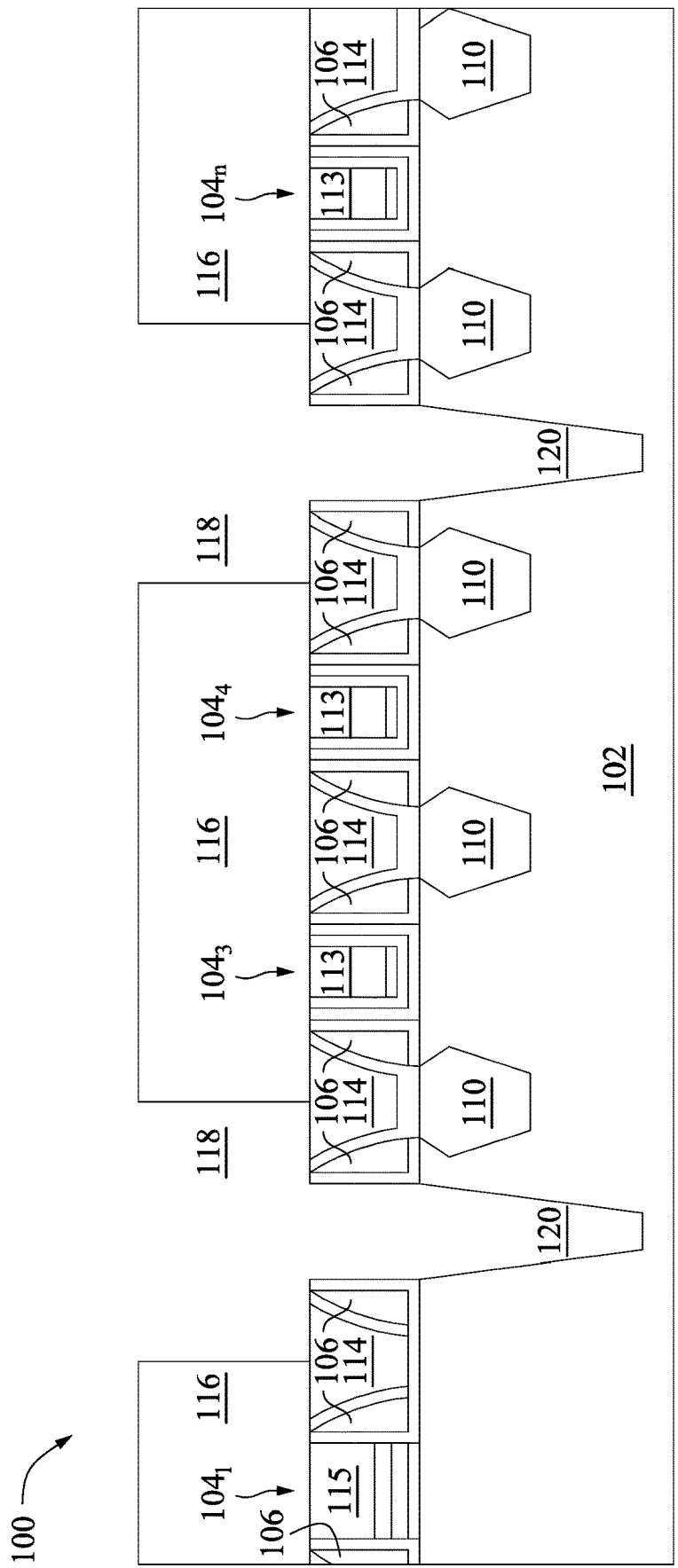

As illustrated in FIG. 1L, once the openings 118 are formed in the photoresist layer 116, a selective etch may be performed in order to remove the dummy gate material (e.g., the hard mask layer 103 and polysilicon layer 101). For instance, the selective etch may remove all material in the dummy gates $104_2$ and $104_5$ down to the substrate 102. Next, a trench 120 is etched into the substrate 102, below the area in which each dummy gate $104_2$ and $104_5$ previously resided. In one example, the trench 120 may be etched deeper into the substrate 102 than the silicon germanium source/drain regions 110.

Figure 1M:
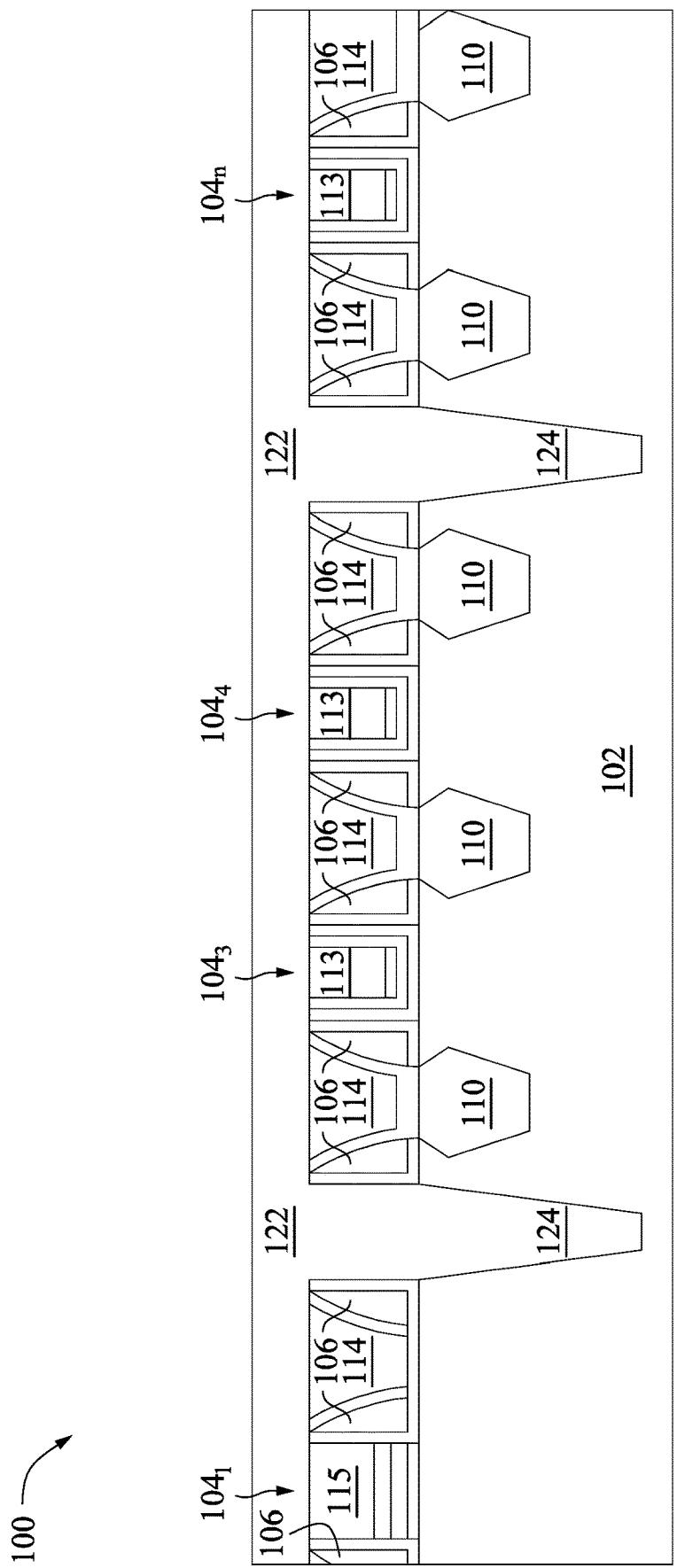

As illustrated in FIG. 1M, once the trenches 120 are formed, the remaining photoresist layer 116 may be stripped in both the PMOS region and the NMOS region of the semiconductor structure 100, e.g., through a wet and/or dry etching process. Next, a second interlayer dielectric layer 122 may be deposited in the trenches 120, and between the gate stacks 104, and over the first interlayer dielectric layer 114, in both the PMOS region and the NMOS region. The second interlayer dielectric layer 122 may comprise the same material as the first interlayer dielectric layer 114 (e.g., phosphosilicate glass, fluorine-doped silicate glass (FSG), tetraethyl orthosilicate (TEOS), or another insulator material, such as silicon oxide, silicon nitride, or silicon oxynitride) and may be deposited using high-density plasma chemical vapor deposition, spin coating, flowable chemical vapor deposition, plasma enhanced chemical vapor deposition, low pressure chemical vapor deposition, or another process.

By filling the trenches 120 with the second interlayer dielectric layer 122, the trenches 120 effectively become shallow trench isolation areas 124 that provide electrical isolation between the gate stacks 104 on either side of the trenches 120. In one example, the shallow trench isolation areas 124 may include thermal oxide liner layers in addition to the insulator material. As can be seen from FIG. 1M, no dummy gate stacks remain in the semiconductor structure 100, either directly above or on either side of the shallow trench isolation area 124 (e.g., at the oxidation diffusion/ shallow trench isolation interface). That is, in one example, the shallow trench isolation areas 124 replace the remaining dummy gate stacks that are not replaced with functional PMOS or NMOS gates. The second interlayer dielectric layer 122 may be planarized (e.g., via CMP).

As can also be seen from FIG. 1M, fabricating the shallow trench isolation areas 124 after the gate stacks 104 and the silicon germanium source/drain regions 110 allows the fully formed silicon germanium source/drain regions 110 to remain intact (e.g., without it appearing that the shallow trench isolation areas 124 truncate or intersect the silicon germanium source/drain regions 110). In other words, the silicon germanium source/drain regions 110 that are positioned adjacent to the shallow trench isolation areas 124 remain intact and do not form facets along the shallow trench isolation areas 124. Thus, the strain inducing effect introduced by the silicon germanium source/drain regions 110 is not undermined.

Although FIGS. 1A-1M illustrate a process for forming the silicon germanium source/drain regions 110 and shallow trench isolation areas 124 in the PMOS region of the semiconductor structure 100, it will be appreciated that a similar process may be used to form similar silicon germanium source/drain regions and shallow trench isolation areas in the NMOS region of the semiconductor structure 100. As discussed above, while silicon germanium may be used to apply a compressive stress to the channel of a p-type MOSFET, silicon germanium may also be used to apply a tensile stress to the channel of an n-type MOSFET.

Figure 2A:
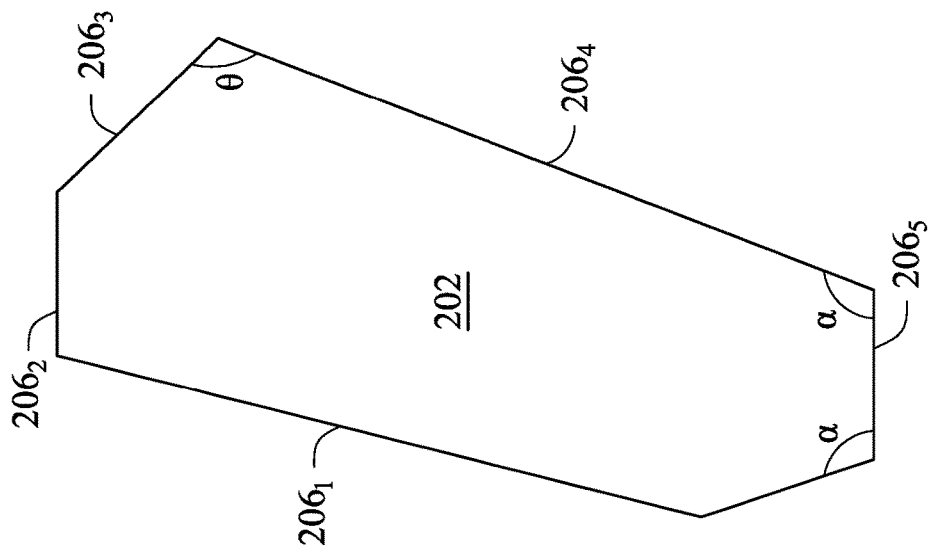
FIG. 2A is a cross sectional view of an example silicon germanium source/drain region that may be produced according to the process illustrated in FIGS. 1A-1M, according to at least one example of the present disclosure.
Figure 2B:
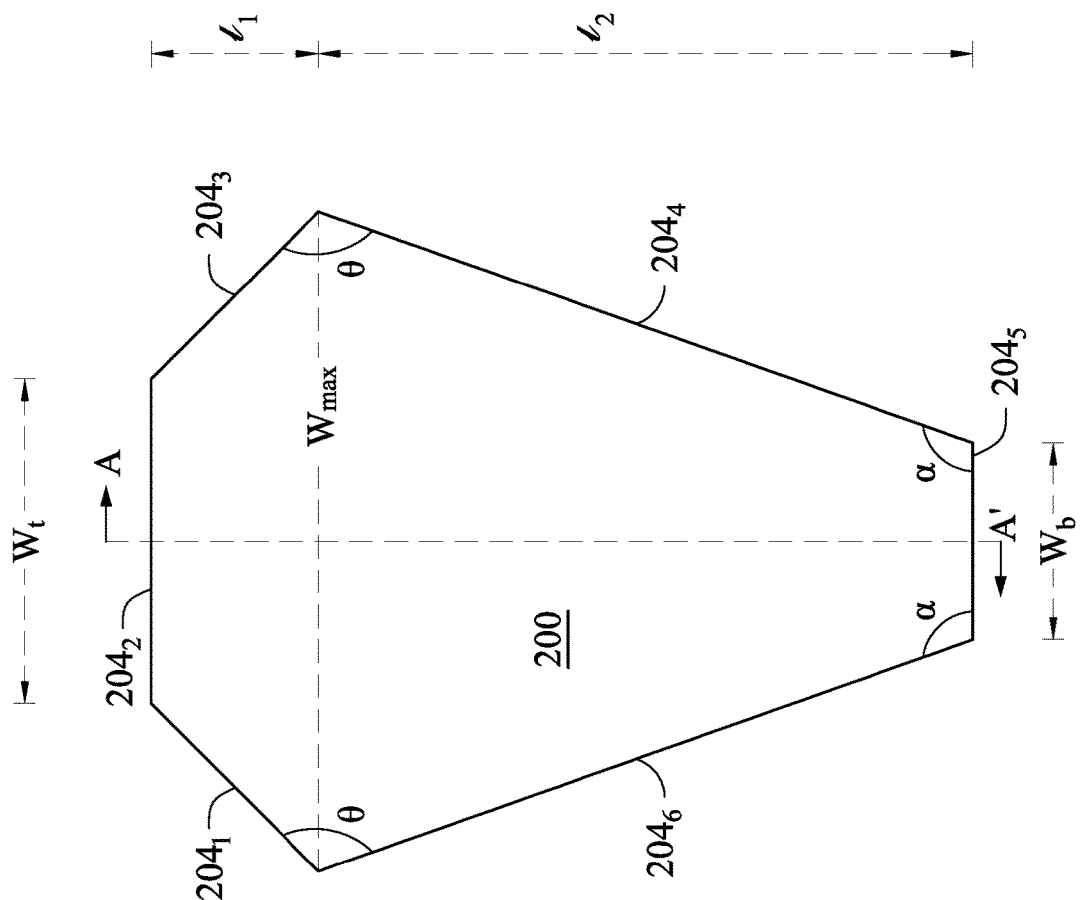
FIG. 2B is a cross sectional view of an example silicon germanium facet that may be produced according to conventional processes.

To further illustrate the advantages of the present disclosure, FIG. 2A is a cross sectional view of an example silicon germanium source/drain region 200 that may be produced according to the process illustrated in FIGS. 1A-1M (e.g., in which the shallow trench isolation regions are fabricated after the metal gates are fabricated), while FIG. 2B is a cross sectional view of an example silicon germanium facet 202 that may be produced according to a conventional process (e.g., in which the shallow trench isolation region may be fabricated before the metal gates are fabricated).

The silicon germanium source/drain region 200 of FIG. 2A may be considered representative of any of the silicon germanium source/drain regions 110 illustrated in FIGS. 1A-1M. As illustrated in FIG. 2A, the silicon germanium source/drain region 200 may be roughly symmetrical about a plane of symmetry A-A'. In one example, the silicon germanium source/drain region 200 comprises six individual planes (i.e., planar faces), i.e., planes $204_1$-$204_6$ (hereinafter collectively referred to as "planes 204" or individually referred to as a "plane 204"). The planes $204_1$, $204_3$, $204_4$, and $204_6$ may be referred to as "shallow planes," while the plane $204_2$ may be referred to as a "top plane," and the plane $204_5$ may be referred to as a "bottom plane." The top plane $204_2$ may have a width $w_t$ that is wider than a width $w_b$ of the bottom plane $204_5$, while the widest part of the silicon germanium source/drain region 200 (i.e., the maximum width, or $w_{max}$) is wider than the width $w_t$ of the top plane $204_2$ (i.e., $w_b < w_t < W_{max}$).

In one example, the etching profile of the silicon germanium source/drain region 200 is defined by the shallow planes 204 in a {111} crystallographic plane of the substrate 102, and the bottom plane $204_5$ in a {100} crystallographic plane of the substrate 102. In one example, the angle θ between any pair of shallow planes 204 may be between approximately 115 and 135 degrees, while the angle α between any shallow plane 204 and the bottom plane $204_5$ may be between approximately 115 and 125 degrees. Thus, the angle θ may be larger than the angle α. As such, in one example, the profile of the silicon germanium source/drain region 200 generally widens in a direction away from the surface of the substrate 102 until the maximum width $m_{max}$ is reached. Then, the profile of the silicon germanium source/drain region 200 narrows in the direction away from the surface of the substrate. Moreover, the linear distance $l_1$ from the top plane $204_2$ to the point of maximum width $w_{max}$ may be shorter than the linear distance $l_2$ from the bottom plane $204_5$ to the point of maximum width $w_{max}$.

Referring to FIG. 2B, it can be seen that the silicon germanium facet 202, in contrast to the silicon germanium source/drain region 200 of FIG. 2A, does not have a plane of symmetry. Moreover, the silicon germanium facet 202 may include fewer planes $206_1$-$206_5$ (hereinafter collectively referred to as "planes 206" or individually referred to as a "plane 206") than the silicon germanium source/drain region 200. Thus may give the silicon germanium facet 202 the appearance of a silicon germanium source/drain region 200 that has been truncated.

Furthermore, some of the angles between the planes 206 of the silicon germanium facet 202 may be different than the angles θ and α between the planes 204 of the silicon germanium source/drain region 200. It should be noted that a silicon germanium facet may take on a different shape from the shape illustrated in FIG. 2B. The purpose of FIG. 2B is to show the difference in geometry between a silicon germanium facet and a fully formed silicon germanium source/drain region.

Figure 3:
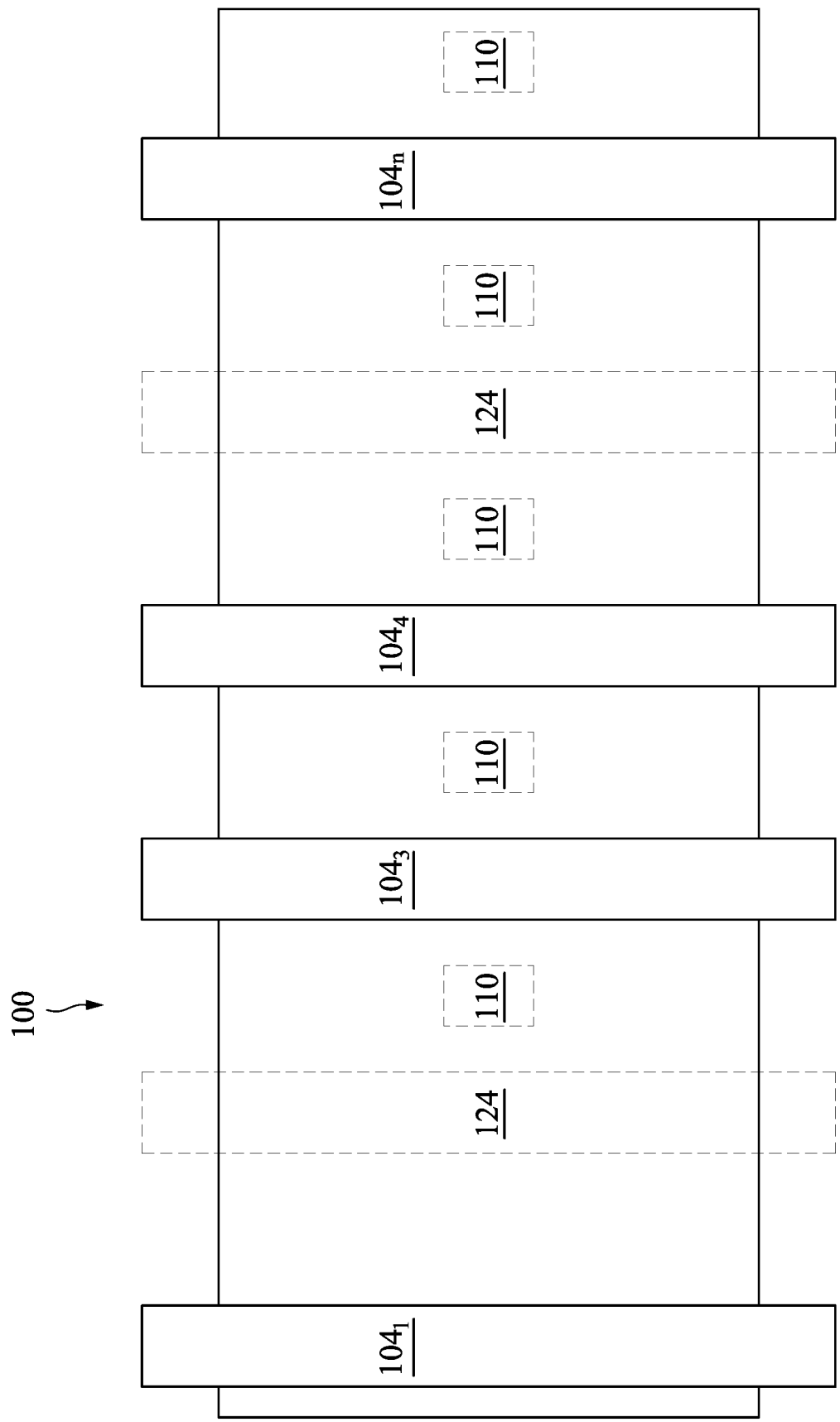
FIG. 3 illustrates a top view of the portion of the semiconductor structure illustrated in FIG. 1M, according to at least one example of the present disclosure.

Moreover, as can be seen from FIG. 3, which illustrates a top view of the portion of the semiconductor structure 100 illustrated in FIG. 1M, the oxide diffusion, or interlayer dielectric layer (comprising first interlayer dielectric layer 114 and second interlayer dielectric layer 122) also remains intact. That is, there is no need for a diffusion break that separates the oxide diffusion layer into two or more separate sections to accommodate additional dummy gate stacks. Thus, the footprint of the semiconductor structure 100 does not need to be enlarged to allow for intact silicon germanium source/drain regions 110 to be maintained.

Further processing steps may be performed into order to ensure that the semiconductor structure 100 comprises a functional CMOS device. For instance, a multilayer interconnect structure may be fabricated in which conductive materials such as copper, tungsten, and/or silicide are patterned into vertical interconnects (e.g., vias and/or contacts) and horizontal interconnects (e.g., metal lines) that provide electrical connection between devices in the CMOS device.

Examples of the present disclosure are not limited to MOS applications, and may be implemented in fabrication processes for other types of semiconductor structures including metal gate stacks. For instance, the semiconductor structure may include a dynamic random access memory (DRAM) cell, a single electron transistor (SET), a fin field effect transistor (finFET), a single-gate transistor, a multi-gate transistor, or another semiconductor structure. Moreover, examples of the present disclosure may be extended to other processes in which it is desirable to avoid the formation of faceted epitaxy, particularly along shallow trench isolation regions.

In one example of the disclosure, a device is provided that includes a semiconductor substrate and a plurality of gate stacks formed on the substrate. A plurality of source/drain regions is formed in the substrate, each source/drain region of the plurality of source/drain regions is positioned adjacent to at least one gate stack of the plurality of gate stacks. The plurality of source/drain regions is formed from silicon germanium. A shallow trench isolation region is positioned between two source/drain regions of the plurality of source/drain regions. The shallow trench isolation region forms a trench in the substrate without intersecting the two source/drain regions.

In another example of the disclosure, a method includes fabricating a plurality of gate stacks on a semiconductor substrate. The plurality of gate stacks includes at least a first subset comprising at least one p-type metal oxide semiconductor device. A plurality of source/drain regions is fabricated in the semiconductor substrate. Each source/drain region of the plurality of source/drain regions is positioned adjacent to at least one gate stack of the plurality of gate stacks. Subsequent to fabricating the plurality of gate stacks and fabricating the plurality of source/drain regions, a shallow trench isolation region is formed in the substrate. The shallow trench isolation region is positioned between two source/drain regions of the plurality of source/drain regions.

In another example of the disclosure, a device includes a semiconductor substrate, an n-type metal oxide semiconductor region formed on the substrate, a p-type metal oxide semiconductor region formed on the substrate, and an oxide diffusion layer surround the n-type metal oxide semiconductor region and the p-type metal oxide semiconductor region, wherein the oxide diffusion layer comprises a single intact layer without a diffusion break. In one example, the p-type metal oxide semiconductor region includes a plurality of p-type metal oxide semiconductor devices formed on the substrate. The p-type metal oxide semiconductor region further includes a plurality of source/drain regions formed from silicon germanium. Each source/drain region of the plurality of source/drain regions is positioned adjacent to at least one p-type metal oxide semiconductor of the plurality of p-type metal oxide semiconductor devices. Furthermore, each source/drain region of the plurality of source/drain regions has a shape that is symmetrical about a plane of symmetry. A shallow trench isolation region is positioned between two source/drain regions of the plurality of source/drain regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a plurality of sacrificial gate structures over a substrate;
   forming source/drain regions in the substrate;
   replacing a first set of the plurality of sacrificial gate structures with PFET gates and replacing a third set of the plurality of sacrificial gate structures with NFET gates; and
   after the replacement, replacing a second set of the plurality of sacrificial gate structures with STI regions.

2. The method of claim 1, wherein the third set of the plurality of sacrificial gate structures are replaced with the NFET gates before replacing the second set of the plurality of sacrificial gate structures with the STI regions.

3. The method of claim 1, wherein the third set of the plurality of sacrificial gate structures are replaced with the NFET gates after replacing the first set of the plurality of sacrificial gate structures with the PFET gates.

4. The method of claim 1, wherein the STI regions are formed of a single continuous material that extends from within the substrate to above a top surface of the PFET gates, and the single continuous material directly contacts a metal layer of at least one of the PFET gates.

5. The method of claim 4, further comprising replacing a third set of the plurality of sacrificial gate structures with NFET gates, wherein the single continuous material of the STI regions also directly contacts a metal layer of at least one of the NFET gates.

6. The method of claim 5, wherein replacing the third set of the plurality of sacrificial gate structures with the NFET gates is performed after replacing the first set of the plurality of sacrificial gate structures with the PFET gates and before replacing the second set of the plurality of sacrificial gate structures with the STI regions.

7. The method of claim 1, wherein the source/drain regions are formed before replacing the second set of the plurality of sacrificial gate structures with the STI regions.

8. The method of claim 1, wherein the STI regions are formed of a single continuous material that spans the NFET gates and the PFET gates.

9. A method comprising:
   forming a plurality of gate stacks over a substrate, the plurality of gate stacks forming first strip patterns extending along a first direction from a top view;
   forming a plurality of shallow trench isolation (STI) regions inlaid in the substrate from a cross-sectional view, the plurality of STI regions forming second strip patterns extending parallel with the first strip patterns of the plurality of gate stacks along the first direction from the top view, the plurality of STI regions being formed of a single continuous material that spans the plurality of the gate stacks from the cross-sectional view; and
   forming source/drain regions alternately arranged with the plurality of gate stacks.

10. The method of claim 9, wherein the single continuous material of the plurality of STI regions directly contacts a metal layer of at least one of the plurality of gate stacks from the cross-sectional view.

11. The method of claim 9, wherein the single continuous material of the plurality of STI regions is phosphosilicate glass.

12. The method of claim 9, wherein each source/drain region of the source/drain regions has a cross-sectional pattern that is symmetrical about a plane of symmetry.

13. The method of claim 9, wherein from the top view, the first strip patterns of the plurality of gate stacks have a same width as the second strip patterns of the plurality of STI regions.

14. The method of claim 9, wherein the source/drain regions are formed of silicon germanium.

15. The method of claim 9, wherein each of the source/drain regions has a hexagonal cross-section.

16. A method comprising:
   forming an N-type field-effect-transistor (NFET) gate over a substrate, the NFET gate having a first strip pattern from a top view;
   forming a P-type field-effect-transistor (PFET) gate over the substrate, the PFET gate having a second strip pattern from the top view; and
   forming an STI region extending into the substrate from a cross-sectional view, the STI region having a third strip pattern interposing the first strip pattern of the NFET gate and the second strip pattern of the PFET gate from the top view, the STI region being formed of a single continuous material that covers both the NFET gate and the PFET gate from the cross-sectional view.

17. The method of claim 16, wherein the single continuous material of the STI region is in contact with a metal layer of the NFET gate.

18. The method of claim 16, wherein the single continuous material of the STI region is in contact with a metal layer of the PFET gate.

19. The method of claim 16, wherein from the top view, the third strip pattern of the STI region has a longitudinal axis parallel with a longitudinal axis of the first strip pattern of the NFET gate.

20. The method of claim 16, wherein from the top view, the third strip pattern of the STI region has a longitudinal axis parallel with a longitudinal axis of the second strip pattern of the PFET gate.

* * * * *